(12) United States Patent
Liu et al.

(10) Patent No.: US 10,790,315 B2
(45) Date of Patent: Sep. 29, 2020

(54) ARRAY SUBSTRATE, DISPLAY PANEL AND DISPLAY DEVICE

(71) Applicants: HEFEI XINSHENG OPTOELECTRONICS TECHNOLOGY CO., LTD., Hefei, Anhui (CN); BOE TECHNOLOGY GROUP CO., LTD., Beijing (CN)

(72) Inventors: Liping Liu, Beijing (CN); Jing Huang, Beijing (CN); Rentan Chen, Beijing (CN)

(73) Assignees: HEFEI XINSHENG OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/315,863

(22) PCT Filed: Mar. 16, 2018

(86) PCT No.: PCT/CN2018/079308
§ 371 (c)(1),
(2) Date: Jan. 7, 2019

(87) PCT Pub. No.: WO2018/177144
PCT Pub. Date: Oct. 4, 2018

(65) Prior Publication Data
US 2019/0259784 A1    Aug. 22, 2019

(30) Foreign Application Priority Data
Mar. 31, 2017 (CN) .......................... 2017 1 0209163

(51) Int. Cl.
H01L 27/12     (2006.01)
H05B 33/04    (2006.01)
G02F 1/1333   (2006.01)

(52) U.S. Cl.
CPC ...... H01L 27/1244 (2013.01); H01L 27/1214 (2013.01); H01L 27/1218 (2013.01);
(Continued)

(58) Field of Classification Search
CPC ....................... H01L 27/1244; H01L 27/1218
See application file for complete search history.

(56) References Cited

U.S. PATENT DOCUMENTS

2015/0102300 A1    4/2015 Gong
2016/0141550 A1    5/2016 Fujino et al.
(Continued)

FOREIGN PATENT DOCUMENTS

CN    104022233 A    9/2014
CN    104199210 A    12/2014
(Continued)

OTHER PUBLICATIONS

International Search Report of PCT/CN2018/079308, dated Jun. 15, 2018, with English translation of the Search Report (Form PCT/ISA/210) and the English translation of the Written Opinion (Form PCT/ISA/237).

(Continued)

*Primary Examiner* — Farun Lu
(74) *Attorney, Agent, or Firm* — Nath, Goldberg & Meyer; Joshua B. Goldberg; Stephanie F. Majkut

(57) ABSTRACT

An array substrate, a display panel and a display device are provided. The array substrate includes a wiring layer and an insulation layer sequentially formed on a base substrate, and a side of the insulation layer of the array substrate distal to the wiring layer includes a binding region. The array substrate further includes a first protection layer located in the binding region of the array substrate, and at least a portion of the first protection layer is flush with an edge of the array substrate.

16 Claims, 3 Drawing Sheets

(52) U.S. Cl.
CPC ......... *H01L 27/1288* (2013.01); *H05B 33/04* (2013.01); *G02F 2001/133331* (2013.01)

(56) References Cited

U.S. PATENT DOCUMENTS

2016/0300863 A1* 10/2016 Koide ................... H01L 27/124
2016/0357056 A1    12/2016 Kang
2018/0046011 A1     2/2018 Tang

FOREIGN PATENT DOCUMENTS

| CN | 104576658 A | 4/2015 |
| CN | 104834143 A | 8/2015 |
| CN | 105572986 A | 5/2016 |
| CN | 106324882 A | 1/2017 |
| CN | 106711160 A | 5/2017 |
| EP | 1282007 A3  | 5/2003 |

OTHER PUBLICATIONS

First Office Action dated Jan. 2, 2019, and Rejection Office Action dated May 7, 2019, for corresponding Chinese application No. 201710209163.4, with English translation.

* cited by examiner

ARRAY SUBSTRATE, DISPLAY PANEL AND DISPLAY DEVICE

CROSS-REFERENCE TO RELATED APPLICATIONS

This is a National Phase Application filed under 35 U.S.C. 371 as a national stage of PCT/CN2018/079308, filed Mar. 16, 2018, an application which claims the priority of Chinese Application No. 201710209163.4, filed Mar. 31, 2017, the contents of which are incorporated herein in their entirety by reference.

TECHNICAL FIELD

The present disclosure relates to the field of display technology, and in particular, relates to an array substrate, a display panel and a display device.

BACKGROUND

In a manufacturing process of a display panel, an array substrate is provided with electrodes, metal wires, and the like thereon, and thus has a larger size in a lengthwise direction thereof and a larger size in a widthwise direction thereof than those of a color filter substrate. A region of the array substrate not overlapped with the color filter substrate in a vertical direction may be referred to as a binding region.

SUMMARY

The present disclosure provides an array substrate, a display panel and a display device.

An aspect of the present disclosure provides an array substrate including a wiring layer and an insulation layer sequentially formed on a base substrate, a side of the insulation layer of the array substrate distal to the wiring layer including a binding region, wherein the array substrate further includes a first protection layer located in the binding region of the array substrate, and at least a portion of the first protection layer is flush with an edge of the array substrate.

In an embodiment, the binding region is located at a side of the array substrate proximal to an opposite substrate in a region not overlapped with the opposite substrate in a vertical direction; and the first protection layer is located at an edge position of the binding region not overlapped with the opposite substrate and/or a corner position of the binding region distal to the opposite substrate.

In an embodiment, a portion of the first protection layer at the edge position of the binding region has a width smaller than a width of a portion of the first protection layer at the corner position of the binding region.

In an embodiment, the array substrate further includes a sealant for assembling the array substrate and the opposite substrate into a cell, a strengthening region located between the binding region and the sealant, and a second protection layer provided in the strengthening region.

Further, the second protection layer is located at a corner position of the strengthening region and/or an edge position of the array substrate in the strengthening region.

In an embodiment, a portion of the second protection layer at the edge position of the array substrate in the strengthening region has a width smaller than a width of a portion of the second protection layer at the corner position of the strengthening region.

In an embodiment, at least one of the first protection layer and the second protection layer is a transparent protection layer.

In an embodiment, the transparent protection layer is made of a photoresist.

The photoresist may be a negative photoresist.

In an embodiment, the first protection layer and the second protection layer are provided in a same layer and have a same thickness. The thickness of the first protection layer or the second protection layer is smaller than a thickness of the sealant, and for example, ranges from 3000 Å to 4000 Å.

Another aspect of the present disclosure provides a display panel including the array substrate provided by the present disclosure and a color filter substrate serving as the opposite substrate. The display panel may be an advanced super dimension switch (ADS) display panel or a high aperture ratio advanced super dimension switch (H-ADS) display panel, in which liquid crystal molecules are rubbed to orientate along a lengthwise direction or a widthwise direction of the display panel.

Yet another aspect of the present disclosure provides a display device including the display panel provided by the present disclosure.

BRIEF DESCRIPTION OF THE DRAWINGS

The accompanying drawings, which are provided for better understanding of the present disclosure and constitute a part of the specification, along with the following specific embodiments are for the purpose of explaining the present disclosure, but are not intended to limit the present disclosure, wherein.

DETAILED DESCRIPTION

The technical solutions of the present disclosure will be clearly and fully described below with reference to the accompanying drawings. It is obvious that the described embodiments are merely a part of embodiments of the present disclosure, but not all embodiments of the present disclosure. All other embodiments obtained by one of ordinary skill in the art based on the embodiments described herein without creative efforts should be considered as falling within the scope of the present disclosure.

Figure 1A:
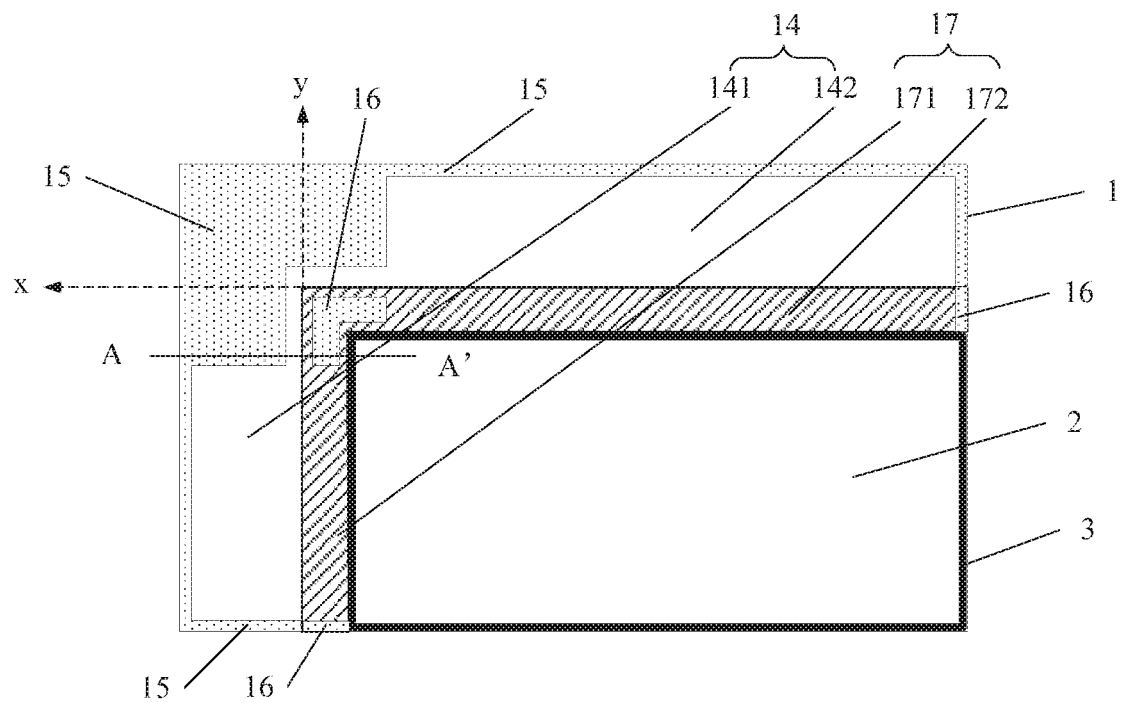
FIG. 1a is a schematic diagram showing an array substrate according to an embodiment of the present disclosure.

The base substrate in the binding region of the array substrate is a single piece of glass, and the color filter substrate does not extend beyond the top of the binding region. Thus, when the base substrate is cut, a portion of the base substrate at an edge position and a corner position of the binding region of the array substrate often subjects to a conchoidal fracture. The base substrate needs to be polished when it contains a raw edge. However, due to lacking sufficient strength, the base substrate is easy to break when being polished. A part of the array substrate at the edge position and/or the corner position of the binding region is broken to result in a notch, which will have a negative influence on a subsequent process and reduce the yield of the cutting process, and such a damage is not easy to detect. Alternatively, a progressive damage occurring during a previous process will have a negative influence on a subsequent process, causing loss of products and materials. As shown in FIGS. 1a, 1b, 2a and 2b, an embodiment of the present disclosure provides an array substrate 1. The array substrate 1 includes a wiring layer 12 and an insulation layer 13 which are sequentially formed on a base substrate 11. The wiring layer 12 may include a gate line, a data line, a test line, etc., and the insulation layer 13 covers the wiring layer 12 to provide insulation and protection. A side of the insulation layer 13 of the array substrate 1 distal to the wiring layer 12 includes a binding region 14. That is, the binding region 14 is a region at the side of the array substrate 1 that is proximal to a color filter substrate 2 to form a cell, and is not overlapped with (or not covered by) the color filter substrate 2 in a vertical direction. That is, the binding region 14 is a region of the array substrate 1 not overlapped with the color filter substrate 2. As shown in FIG. 1a, in general, an area of the color filter substrate 2 is smaller than an area of the array substrate 1. When the color filter substrate 2 and the array substrate 1 are assembled to form a cell, two edges of the color filter substrate 2 and two edges of the array substrate 1 are almost completely overlapped, but the other two edges of the array substrate 1 will not be covered by the color filter substrate 2. The binding region 14 is located in a region of the array substrate not covered by the color filter substrate 2. As shown in FIG. 1a, the binding region 14 may include a first binding sub-region 141 extending along a widthwise direction of the array substrate 1 (i.e., the short-side direction of the array substrate 1 shown in FIG. 1a) and a second binding sub-region 142 extending along a lengthwise direction of the array substrate 1 (i.e., the long-side direction of the array substrate 1 shown in FIG. 1a). The array substrate 1 further includes a first protection layer 15, which is located in the binding region 14 of the array substrate 1, and at least a portion of the first protection layer 15 is flush with an edge of the array substrate 1 distal to (or not right opposite to, or not covered by) the color filter substrate 2.

By providing the first protection layer 15, at least a portion of which is flush with an edge of the array substrate 1, in the binding region 14 of the array substrate 1, the first protection layer 15 can support the base substrate 11 to a certain extent to enhance the strength of the base substrate 11 during a cutting process of the array substrate 1, thereby avoiding damage to the base substrate 11 and increasing the yield of the cutting process.

Specifically, as shown in FIG. 1a, the first protection layer 15 may be located at an edge position of the array substrate 1 that is not right opposite to the color filter substrate 2 (i.e., the edges of the array substrate 1 in the first binding sub-region 141 and the second binding sub-region 142) and a corner position of the binding region 14 (i.e., the region of the first binding sub-region 141 and the second binding sub-region 142 in which the first binding layer 15 has a relatively large width).

Since upon being impacted, the corner position of the binding region 14 is more easily broken to result in a notch in the array substrate 1 than the edge position of the array substrate 1, a portion of the first protection layer 15 at the corner position of the binding region 14 may have a width larger than a width of a portion of the first protection layer 15 at the edge position of the array substrate 1. In this way, the corner position of the array substrate 1 can be protected more effectively, and the breakage rate of the array substrate 1 can be reduced.

Figure 2A:
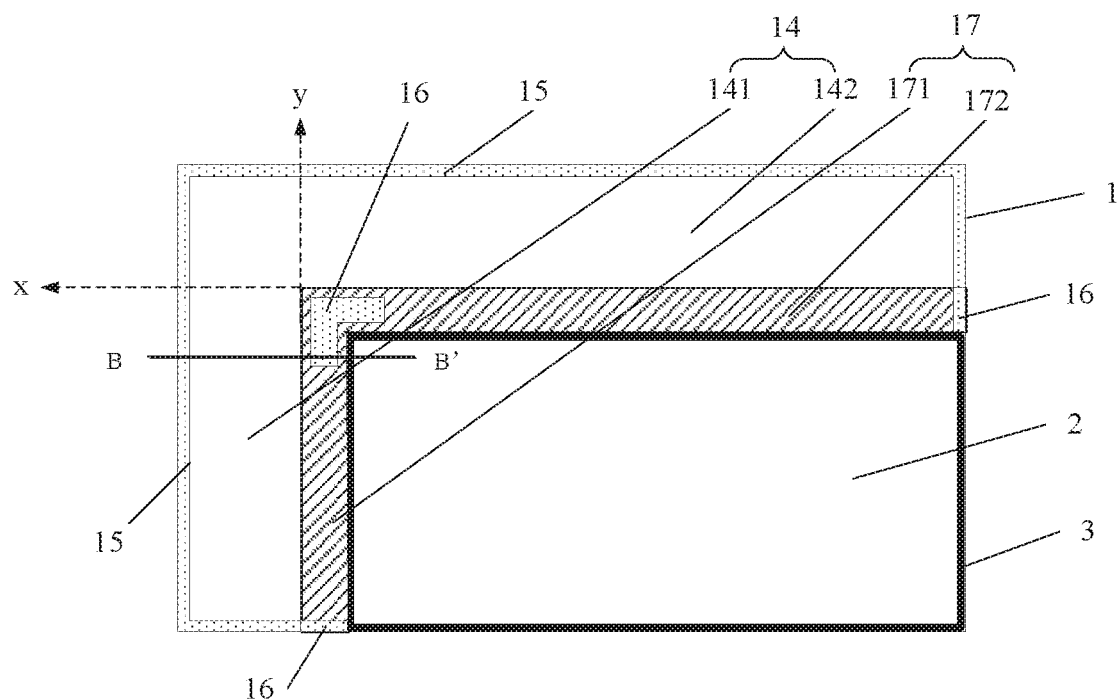
FIG. 2a is a schematic diagram showing an array substrate according to an embodiment of the present disclosure.

As shown in FIG. 2a, the first protection layer 15 may be provided only at the edge position of the array substrate 1 that is not covered by the color filter substrate 2. Alternatively, the first protection layer 15 may be provided only at the corner position of the binding region 14 (i.e., the region of the first binding sub-region 141 and the second binding sub-region 142 in which the first binding layer 15 has a relatively large width, as shown in FIG. 1a). It would be readily appreciated by one of ordinary skill in the art that, the first protection layer 15 provided both at the edge position of the array substrate 1 that is not covered by the color filter substrate 2 and at the corner position of the binding region 14 as shown in FIG. 1a can provide better protection to the array substrate 1 and the base substrate 11.

Further, a sealant 3 may be provided between the array substrate 1 and the color filter substrate 2 for sealing. The array substrate 1 may further include a second protection layer 16 located in a strengthening region 17 which is located between the binding region 14 and the sealant 3.

Figure 1B:
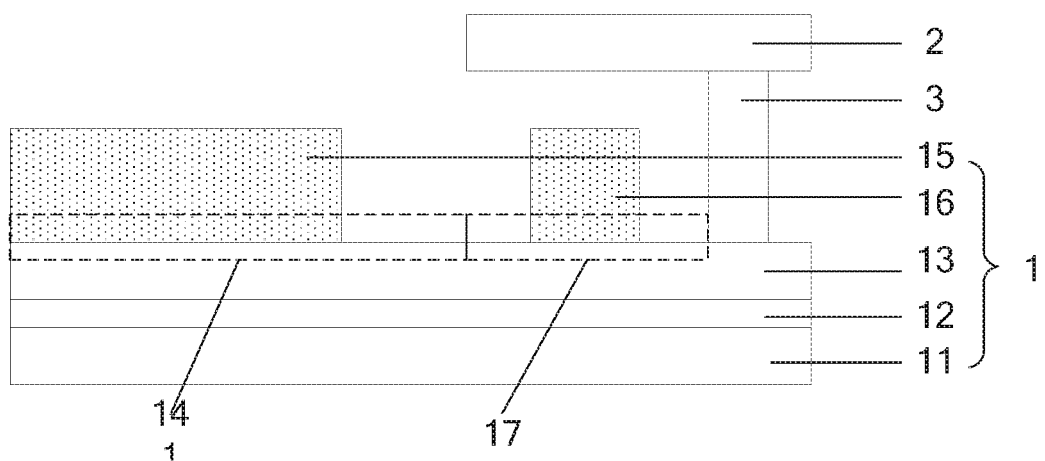
FIG. 1b is a schematic diagram showing a sectional view of the array substrate shown in FIG. 1a taken along the line A-A'.
Figure 2B:
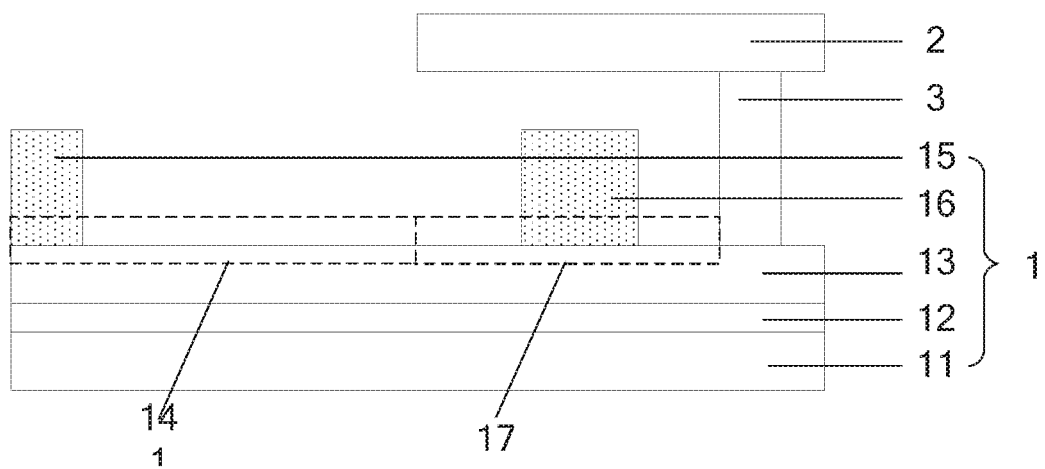
FIG. 2b is a schematic diagram showing a sectional view of the array substrate shown in FIG. 2a taken along the line B-B'.

As shown in FIGS. 1b and 2b, the strengthening region 17 is a projection region of the region between an edge of the sealant 3 and an edge of the color filter substrate 2 on the array substrate 1. Similar to the binding region 14, the strengthening region 17 may also include a first strengthening sub-region 171 extending along the widthwise direction of the array substrate 1 (i.e., the short-side direction of the array substrate 1 shown in FIG. 1a) and a second strengthening sub-region 172 extending along the lengthwise direction of the array substrate 1 (i.e., the long-side direction of the array substrate 1 shown in FIG. 1a). Referring to FIGS. 1a and 2a, the positions shown by the dashed arrows in the figures are the positions of cutting lines of the color filter substrate 2. The color filter substrate 2 may also include a base substrate (not shown). When the color filter substrate 2 is cut, a force is applied to an edge of the base substrate of the color filter substrate 2. Since a region of the color filter substrate 2 overlapped with the strengthening region 17 is overhanging, an edge of the region of the color filter substrate 2 right opposite to the strengthening region 17 is prone to be damaged. Therefore, the second protection layer 16 is provided in the strengthening region 17, which can provide supporting and buffering functions to the color filter substrate 2 when the color filter substrate 2 is cut, thereby reducing the breakage rate of the base substrate of the color filter substrate 2.

Specifically, as shown in FIGS. 1a and 2a, the second protection layer 16 may be located at a corner position of the strengthening region 17 and an edge position of the array substrate 1 in the strengthening region 17. A portion of the second protection layer 16 at the corner position of the strengthening region 17 may have a width larger than a width of a portion of the second protection layer 16 at the edge position of the array substrate 1.

When a cutting process is performed along the lengthwise direction (i.e., the x-direction) of the color filter substrate 2, both the portion of the second protection layer 16 at the corner position of the strengthening region 17 and the portion of the second protection layer 16 at the edge position along the widthwise direction of the array substrate 1 in the strengthening region 17 (i.e., the portion of the second protection layer 16 at the rightmost end of the second strengthening sub-region 172 shown in FIGS. 1a and 2a) jointly supports the color filter substrate 2, and can buffer the force generated by the cutting process to a certain extent. When a cutting process is performed along the widthwise direction (i.e., the y-direction) of the color filter substrate 2, both the portion of the second protection layer 16 at the corner position of the strengthening region 17 and the portion of the second protection layer 16 at the edge position along the lengthwise direction of the array substrate 1 in the strengthening region 17 (i.e., the portion of the second protection layer 16 at the lowermost end of the first strengthening sub-region 171 shown in FIGS. 1a and 2a) jointly supports the color filter substrate 2, and can buffer the force generated by the cutting process to a certain extent.

It should be noted that the second protection layer 16 may be provided only at the corner position of the strengthening region 17, or only at the edge position of the array substrate 1 in the strengthening region 17. It would be readily appreciated by one of ordinary skill in the art that, the second protection layer 16 provided at both the corner position of the strengthening region 17 and the edge position of the array substrate 1 in the strengthening region 17 (i.e., the arrangement as shown in FIGS. 1a and 2a) can provide better protection to the base substrate of the color filter substrate 2.

Since alignment marks and cutting marks are provided on the array substrate 1 and the color filter substrate 2, each of the first protection layer 15 and the second protection layer 16 may be a transparent protection layer to avoid blocking of the alignment marks and the cutting marks, thereby ensuring an aligning and assembling process and a cutting process to be performed smoothly. The transparent protection layer may be formed of a photoresist, such as a negative photoresist.

The first protection layer 15 and the second protection layer 16 may be provided in a same layer, made of a same material, and have a same thickness, such that patterns of the first protection layer 15 and the second protection layer 16 may be simultaneously formed by one patterning process, thereby simplifying the manufacturing process thereof.

Figure 3:
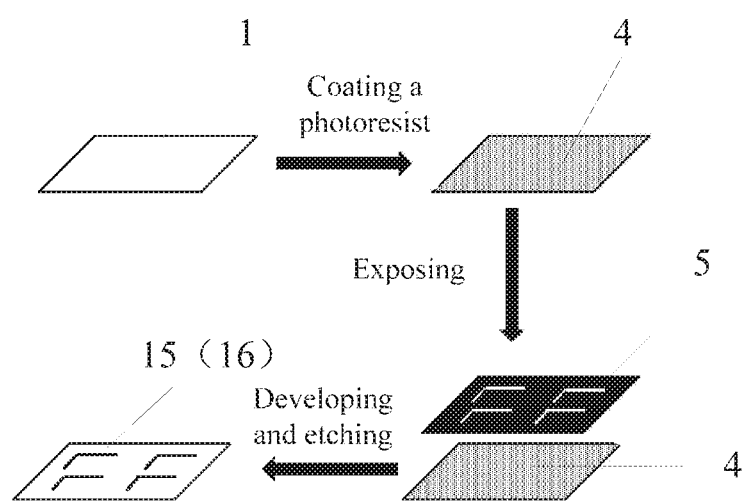
FIG. 3 is a schematic flowchart showing processes for forming a first or second protection layer according to an embodiment of the present disclosure.

As shown in FIG. 3, a step of forming the first protection layer 15 and the second protection layer 16 may be performed after a step of forming the insulation layer 13 is completed. That is, on the array substrate 1 on which the formation of the insulation layer 13 is completed, a photoresist 4 is coated, then the photoresist 4 is exposed by using a mask plate 5, developed and etched, so that a pattern of the first protection layer 15 is formed at the edge position of the insulation layer 13 that is not covered by the color filter substrate 2 and/or the corner position of the binding region 14, and a pattern of the second protection layer 16 is formed at the corner position of the strengthening layer 17 on the insulation layer 13 and/or the edge position of the insulation layer 13 in the strengthening region 17.

In the processes shown in FIG. 3, description is made by taking the case where the photoresist 4 is a negative photoresist and a pattern opposite to the light-blocking pattern of the mask plate 5 is formed on the array substrate 1 as an example. That is, the resultant pattern of the first protection layer 15 and the second protection layer 16 is the same as the pattern of a hollowed-out portion of the mask plate 5. However, it should be noted that, in a process of forming the first protection layer 15 and the second protection layer 16, a positive photoresist or a negative photoresist may be employed according to the structure and the pattern of the mask plate.

In an embodiment, each of the first protection layer 15 and the second protection layer 16 may have a thickness ranging from 3000 Å to 4000 Å.

As shown in FIGS. 1b and 2b, both the first protection layer 15 and the second protection layer 16 may have a thickness slightly smaller than a thickness of the sealant 3. That is, a gap may be formed between the color filter substrate 2 and both of the first protection layer 15 and the second protection layer 16. When the color filter substrate 2 is cut, a downward force is applied to the color filter substrate 2, which will cause the sealant 3 to be compressed, and the color filter substrate 2 may be in contact with the second protection layer 16 located thereunder. As a result, the second protection layer 16 can provide auxiliary supporting and buffering functions to the color filter substrate 2.

An embodiment of the present disclosure provides a display panel, which includes a color filter substrate 2 and the array substrate 1 provided by the present disclosure.

By providing the first protection layer 15, at least a portion of which is flush with an edge of the array substrate 1, in the binding region 14 of the array substrate 1, the first protection layer 15 can support the base substrate 11 to a certain extent to enhance the strength of the base substrate 11 during a cutting process of the array substrate 1, thereby avoiding damage to the base substrate 11 and increasing the yield of the cutting process.

The display panel may be an advanced super dimension switch (ADS) display panel or a high aperture ratio ADS (H-ADS) display panel, in which liquid crystal molecules are orientated along a lengthwise direction or a widthwise direction of the display panel by a rubbing operation. As shown in FIGS. 1a and 2a, a region AA (i.e., a display region) of the display panel is located within the region surrounded by the sealant 3, and both the first protection layer 15 and the second protection layer 16 are located outside the AA region, which will not affect the rubbing operation performed in the AA region so that the liquid crystal molecules are orientated along the lengthwise direction or the widthwise direction of the display panel.

In the present disclosure, a transparent first protection layer is provided in a weak region of the array substrate prone to breakage, such as at the edge position of the binding region and at the corner position of the binding region of the array substrate, and the first protection layer is provided outside the AA region. Such an arrangement can be applied to the ADS display panel or the H-ADS display panel, in which liquid crystal molecules are rubbed to orientate along a lengthwise direction or a widthwise direction of the display panel.

The array substrate and the display panel according to the embodiments of the present disclosure can locally strengthen the array substrate and the color filter substrate to reduce damage to or notches in an edge or a corner thereof, and can reduce downtime impact and product loss in a subsequent process caused by a progressive damage.

An embodiment of the present disclosure provides a display device, which includes the display panel provided by the present disclosure.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. An array substrate, comprising a wiring layer and an insulation layer sequentially formed on a base substrate, a side of the insulation layer of the array substrate distal to the wiring layer comprising a binding region, wherein the array substrate further comprises a first protection layer located in the binding region of the array substrate, and at least a portion of the first protection layer is flush with an edge of the array substrate;

wherein the binding region is located at a side of the array substrate proximal to an opposite substrate in a region not overlapped with the opposite substrate in a vertical direction; and the array substrate further comprises a sealant for assembling the array substrate and the opposite substrate into a cell, a strengthening region located between the binding region and the sealant, and a second protection layer provided in the strengthening region.

2. The array substrate according to claim 1, wherein the first protection layer is located at an edge position of the binding region not overlapped with the opposite substrate and/or a corner position of the binding region distal to the opposite substrate.

3. The array substrate according to claim 2, wherein a portion of the first protection layer at the edge position of the binding region has a width smaller than a width of a portion of the first protection layer at the corner position of the binding region.

4. The array substrate according to claim 1, wherein the second protection layer is located at a corner position of the strengthening region and/or an edge position of the array substrate in the strengthening region.

5. The array substrate according to claim 4, wherein a portion of the second protection layer at the edge position of the array substrate in the strengthening region has a width smaller than a width of a portion of the second protection layer at the corner position of the strengthening region.

6. The array substrate according to claim 1, wherein at least one of the first protection layer and the second protection layer is a transparent protection layer.

7. The array substrate according to claim 6, wherein the transparent protection layer is made of a photoresist.

8. The array substrate according to claim 7, wherein the photoresist is a negative photoresist.

9. The array substrate according to claim 1, wherein the first protection layer and the second protection layer are provided in a same layer and have a same thickness.

10. The array substrate according to claim 9, wherein the thickness of the first protection layer or the second protection layer is smaller than a thickness of the sealant.

11. The array substrate according to claim 10, wherein the thickness of the first protection layer or the second protection layer ranges from 3000 Å to 4000 Å.

12. A display panel, comprising the array substrate according to claim 1 and a color filter substrate serving as the opposite substrate.

13. The display panel according to claim 12, wherein the display panel is an advanced super dimension switch (ADS) display panel or a high aperture ratio advanced super dimension switch (H-ADS) display panel.

14. A display device, comprising the display panel according to claim 12.

15. The array substrate according to claim 4, wherein at least one of the first protection layer and the second protection layer is a transparent protection layer.

16. The array substrate according to claim 5, wherein at least one of the first protection layer and the second protection layer is a transparent protection layer.

* * * * *